United States Patent
Bach et al.

(10) Patent No.: US 10,348,326 B2
(45) Date of Patent: Jul. 9, 2019

(54) DIGITAL SILICON MICROPHONE WITH INTERPOLATION

(71) Applicant: Infineon Technologies AG, Neubiberg (DE)

(72) Inventors: Elmar Bach, Villach (AT); Dietmar Straeussnigg, Villach (AT); Luca Valli, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/790,848

(22) Filed: Oct. 23, 2017

(65) Prior Publication Data

US 2019/0123762 A1     Apr. 25, 2019

(51) Int. Cl.
*H03M 3/00* (2006.01)
*H03H 17/04* (2006.01)
*H04R 3/00* (2006.01)

(52) U.S. Cl.
CPC ........ *H03M 3/496* (2013.01); *H03H 17/0416* (2013.01); *H03M 3/32* (2013.01); *H03M 3/368* (2013.01); *H04R 3/00* (2013.01); *H04R 2201/003* (2013.01)

(58) Field of Classification Search
CPC .......... H03M 3/32; H03M 3/368; H04R 3/00; H04R 2201/0034
See application file for complete search history.

(56) References Cited

U.S. PATENT DOCUMENTS

| | | | |
|---|---|---|---|
| 5,963,160 A * | 10/1999 | Wilson | H03H 17/06 341/143 |
| 8,611,551 B1 | 12/2013 | Massie et al. | |
| 9,742,430 B1 * | 8/2017 | Barrenscheen | H03M 3/462 |
| 9,941,895 B2 * | 4/2018 | Fan | H03M 1/1245 |
| 2007/0127761 A1 | 6/2007 | Poulsen | |
| 2008/0186218 A1 | 8/2008 | Ohkuri et al. | |
| 2012/0140942 A1 * | 6/2012 | Loeda | G10K 11/178 381/71.11 |
| 2015/0281836 A1 * | 10/2015 | Nguyen | H04R 3/00 381/120 |
| 2018/0014124 A1 | 1/2018 | Straeussnigg et al. | |

OTHER PUBLICATIONS

Dehe et al., "The Infineon Silicon MEMS Microphone", DOI 10.5162/sensor2013/A4.3, AMA Conferences 2013, pp. 95-99.
Lewis, Jerad, "Analog and Digital MEMS Microphone Design Considerations", Analog Devices, Technical Article MS-2472, 2013, 4 pages.
Knowles, "I2S Output Digital Microphone", SPH0645LM4H-B Rev B Datasheet, 2015, 12 pages.

(Continued)

*Primary Examiner* — Regina N Holder
(74) *Attorney, Agent, or Firm* — Slater Matsil, LLP (57) ABSTRACT

In accordance with an embodiment, a digital microphone interface circuit includes a delta-sigma analog-to-digital converter (ADC) having an input configured to be coupled to a microphone, a digital lowpass filter coupled to an output of the delta-sigma ADC, and a digital sigma-delta modulator coupled to an output of the digital lowpass filter. The delta-sigma ADC, the digital lowpass filter, and the digital sigma-delta modulator are configured to operate at different sampling frequencies.

17 Claims, 7 Drawing Sheets

(56) References Cited

OTHER PUBLICATIONS

Sony Corporation, "An Introduction to Digital Wireless Microphone Technology", www.sonybiz.net/go-digital, 2007, 12 pages.
Van Rhijn, Arie, "Digital Microphones—Applications and System Partitioning", Amplifier Products, LM4665, LMV1012, Literature No. SNAA101, Texas Instruments, 2011, 7 pages.

* cited by examiner

DIGITAL SILICON MICROPHONE WITH INTERPOLATION

TECHNICAL FIELD

The present invention relates generally to a system and method for microphone signal processing, and, in particular embodiments, to a system and method of an efficient digital microphone interface circuit with an interpolation filter.

BACKGROUND

A digital microphone converts an acoustic pressure wave to a digital audio signal. The output of the digital microphone is usually processed by a separate codec device or another separate audio signal processing system. Thus, depending on specifications of different codec devices and audio signal processing systems, the digital microphone may to work at a variety of clock rates/sampling frequencies, and the output signal stream of the digital microphone may support different rates and formats. The digital microphone may also be compact (or area efficient) and power efficient in order for it to be integrated with other devices, especially when being used by today's power sensitive embedded devices and mobile applications. These features bring challenge to a conventional digital microphone where the whole system has to be designed for the highest clock rate.

The conventional design may not be power efficient because key electronic components of a digital microphone (e.g., a digital filter, an analog-to-digital converter (ADC), and a digital modulator, etc.) may consume more power when working at higher frequencies. For instance, as the frequency of the oversampled ADC increases, there is a corresponding decrease in the settling time of the ADC. In some cases, more power is consumed to effect the settling time. In addition, characteristics of a digital filter may vary depending on the sampling frequency the filter operates at, which either affects the performance of the digital filter when switching to a different sampling frequency, or uses an adaptation of programming coefficients of the digital filters. Therefore, an efficient digital microphone implementation topology for supporting multiple sampling frequencies is desired.

SUMMARY

In accordance with a preferred embodiment of the present invention, a digital microphone interface circuit includes a delta-sigma analog-to-digital converter (ADC) having an input configured to be coupled to a microphone, a digital lowpass filter coupled to an output of the delta-sigma ADC, and a digital sigma-delta modulator coupled to an output of the digital lowpass filter, where the delta-sigma ADC, the digital lowpass filter, and the digital sigma-delta modulator are configured to operate at different sampling frequencies.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a system and method for a digital microphone interface circuit. The invention may also be applied to systems and applications that convert an analog input from other sensors into a digital signal stream, where the digital sigma stream has to meet different sampling frequency and output format specifications. Such systems and applications include interface circuits for a camera, an accelerometer, a gyroscope, a light sensor, or a proximity sensor, etc.

In embodiments of the present invention, electronic components of a digital microphone interface circuit, such as an analog-to-digital converter (ADC) and different types of digital filters, are allowed to operate at sampling frequencies lower than a target sampling frequency. Working at a reduced frequency makes it possible for the electronic components to improve the power efficiency and the area efficiency. Advantages of embodiments include the ability to target a wide range of audio applications using a scalable microphone interface circuit with optimized filters.

Figure 1:
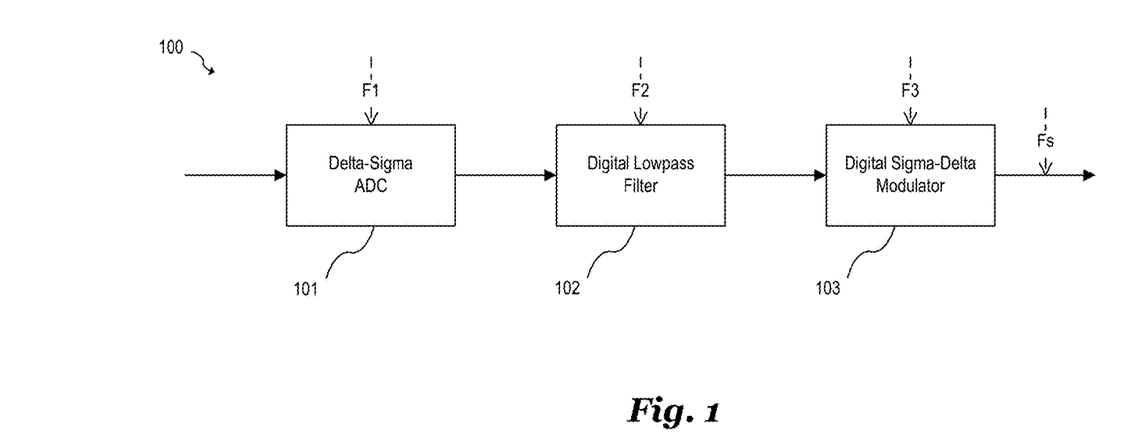
FIG. 1 illustrates a block diagram of an embodiment digital microphone interface circuit.

FIG. 1 illustrates a block diagram of an embodiment digital microphone interface circuit 100 that includes a delta-sigma ADC 101, a digital lowpass filter 102 and a digital sigma-delta modulator 103. As shown, delta-sigma ADC 101 is configured to operate at sampling frequency F1. Digital lowpass filter 102 is coupled to an output of delta-sigma ADC 101, and is configured to operate at sampling frequency F2. Digital sigma-delta modulator 103 is coupled to an output of digital lowpass filter 102, and is configured to operate at sampling frequency F3.

Delta-sigma ADC 101 is used to convert an analog input signal into a digital signal. In embodiments of the present invention, the analog input signal may come from a microphone sensor with a transducer (e.g., a Micro-Electro-Mechanical Systems (MEMS) transducer), which converts a sound pressure level of an acoustic wave into a voltage. The digital output of delta-sigma ADC 101 may be a digital signal stream of sampling frequency F1. In various embodiments, the digital signal stream is a multi-bit signal stream. The digital output of delta-sigma ADC 101 is then processed by digital lowpass filter 102, which removes high frequency components or quantization noises in the signal. Digital sigma-delta modulator 103 modulates an output signal of digital lowpass filter 102, and generates an output signal of sampling frequency F3. In some embodiments, the output signal of digital sigma-delta modulator 103 is a binary sequence or namely a bitstream.

A conventional microphone circuit may use a structure similar to the one shown in FIG. 1, but may have its electronic components operating at the target sampling frequencies Fs (e.g., F1=F2=F3=Fs). In embodiments of the present invention, at least two of sampling frequencies of F1, F2 and F3 are configured to be different from each other. In particular, at least one of F1 and F3 is higher than F2. Thus, electronic components of a digital microphone interface circuit may operate at a reduced sampling frequency and an output of the digital microphone may still meet the target sampling frequency Fs. F1, F2, F3 and Fs may range substantially from 750 KHz to 8 MHz. Alternatively, frequencies outside of this range may also be used.

Figure 2:
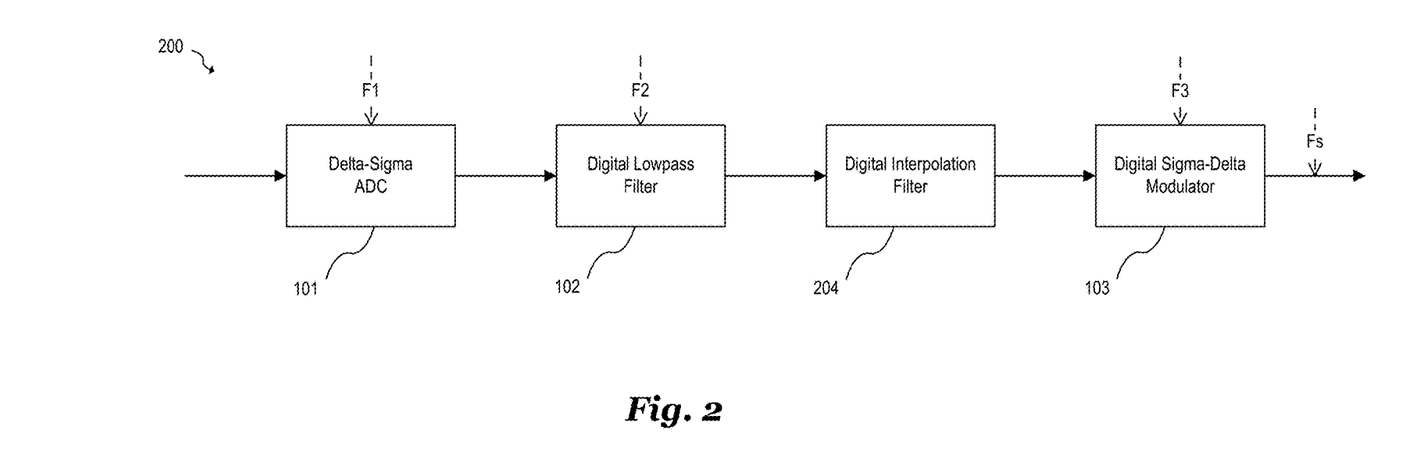
FIG. 2 illustrates a block diagram of another embodiment digital microphone interface circuit.

FIG. 2 illustrates a block diagram of an embodiment digital microphone interface circuit 200 that includes a delta-sigma ADC 101, a digital lowpass filter 102, a digital interpolation filter 204 and a digital sigma-delta modulator 103. As shown, delta-sigma ADC 101 is configured to operate at sampling frequency F1. Digital lowpass filter 102 is coupled to an output of delta-sigma ADC 101, and is configured to operate at sampling frequency F2. Digital interpolation filter 204 is coupled to an output of digital lowpass filter 102. Digital sigma-delta modulator 103 is coupled to an output of digital interpolation filter 204, and is configured to operate at sampling frequency F3. In various embodiments, F1 is equal to F2, and F3 is higher than F1 and F2. An outside audio signal processing device (e.g., a codec unit) may be coupled to an output of digital microphone interface circuit 200. F3 is equal to the target sampling frequency Fs specified by the outside audio signal processing device. Digital interpolation filter 204 increases (upsamples) the sampling frequency of an output signal of digital lowpass filter 102 from F2 to F3. The interpolation factor of digital interpolation filter 204 is equal to $$\frac{F_3}{F_2},$$

which is an integer or a rational fraction larger than 1. Not only may a settling time specification for delta-sigma ADC 101 be relaxed, but the power consumption of digital microphone interface circuit 200 may be decreased because delta-sigma ADC 101 and digital lowpass filter 102 are allowed to work at a reduced sampling frequency. Furthermore, the same delta-sigma ADC and digital lowpass filter can be used to support different target sampling frequencies when selecting a suitable digital interpolation filter and a suitable digital sigma-delta modulator.

In one example, delta-sigma ADC 201 and digital lowpass filter 102 operate at 3 MHz (F1=F2=3 MHz), and digital sigma-delta modulator 103 operates at 6 MHz (F3=6 MHz). Digital interpolation filter 204 upsamples the output signal of digital lowpass filter 102 with an interpolation factor 2, which may be implemented by repeating every sample of the output signal of digital lowpass filter 102. In other embodiments, the target sampling frequency Fs may be 8 MHz or higher.

Figure 3:
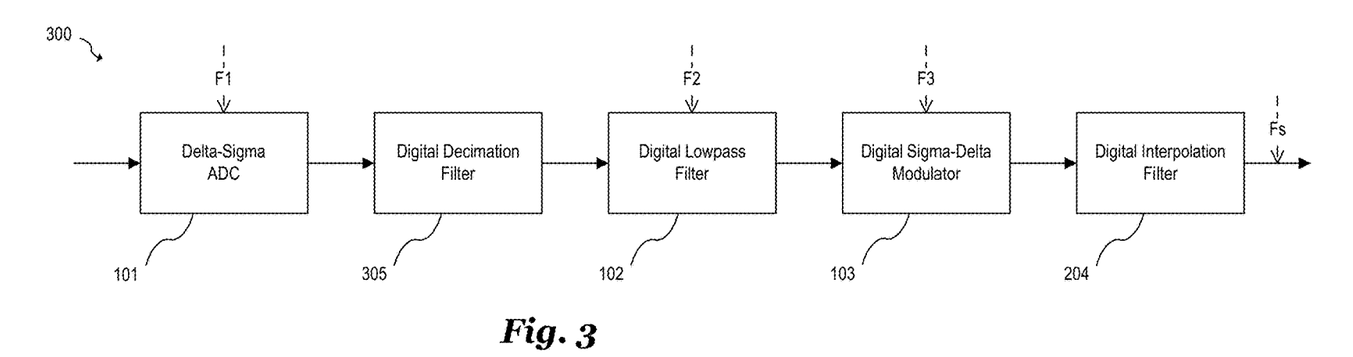
FIG. 3 illustrates a block diagram of another embodiment digital microphone interface circuit.

In some embodiments, the delta-sigma ADC may work at a higher sampling frequency in order to meet a particular performance specification—for instance, a sound pressure level of 128 dB. The digital lowpass filter and the digital sigma-delta modulator are configured to work at a lower sampling frequency. FIG. 3 illustrates a block diagram of another embodiment digital microphone interface circuit 300 for such a case. As shown, digital microphone interface circuit 300 includes a delta-sigma ADC 101, a digital decimation filter 305, a digital lowpass filter 102, a digital sigma-delta modulator 103 and a digital interpolation filter 204. Delta-sigma ADC 101 is configured to operate at sampling frequency F1. Digital decimation filter 305 is coupled to an output of delta-sigma ADC 101. Digital lowpass filter 102 is coupled to an output of digital decimation filter 305, and is configured to operate at sampling frequency F2. Digital sigma-delta modulator 103 is coupled to an output of digital lowpass filter 102, and is configured to operate at sampling frequency F3. Digital interpolation filter 304 is coupled to an output of digital sigma-delta modulator 103.

Sampling frequency F1 is equal to or lower than the target sampling frequency Fs. F2 is equal to F3, and both F2 and F3 are lower than F1. Digital decimation filter 305 decreases (downsamples) the sampling frequency of an output signal of delta-sigma ADC 101 from F1 to F2. The decimation factor of digital decimation filter 305 is equal to $$\frac{F_1}{F_2},$$

which is an integer or a rational fraction larger than 1. Digital interpolation filter 204 increases the sampling frequency of an output signal of digital sigma-delta modulator 103 from F3 to Fs. The interpolation factor of digital interpolation filter 204 is equal to $$\frac{F_s}{F_3},$$

which is also an integer or a rational fraction larger than 1.

In one example, delta-sigma ADC 101 operates at the target sampling frequency 3 MHz (F1=Fs=3 MHz). Digital decimation filter 305 downsamples an output signal of delta-sigma ADC 101 by factor 2. Digital lowpass filter 102 and digital sigma-delta modulator 103 operate at 1.5 MHz (F2=F3=1.5 MHz). Then digital interpolation filter 204 upsamples an output signal of digital sigma-delta modulator 103 by 2. In some other examples, F1 may be lower than the target sampling frequency Fs.

Figure 4:
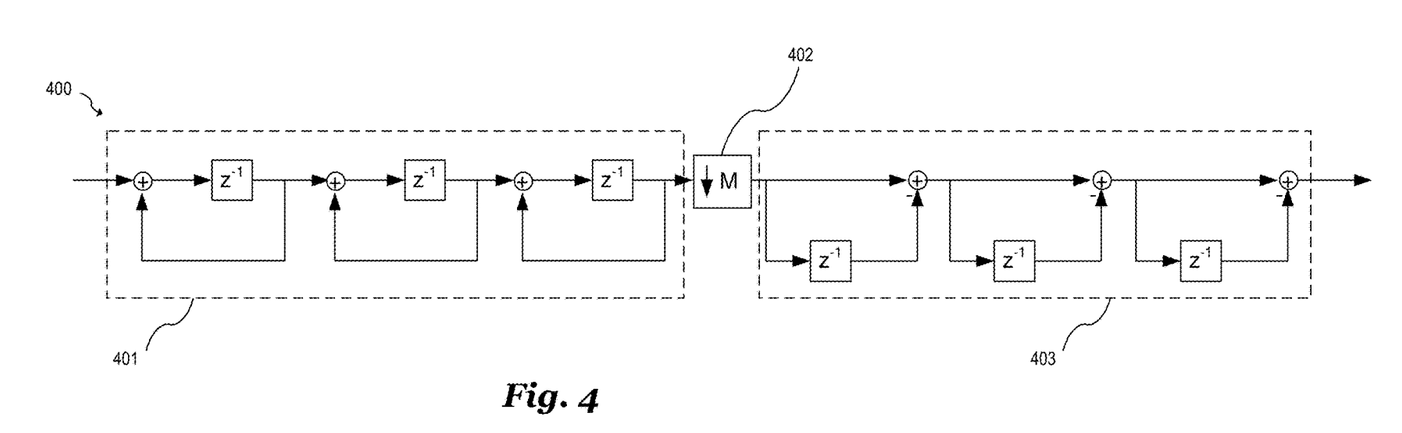
FIG. 4 illustrates an embodiment of a digital decimation filter.

The digital decimation filter may be implemented by a standard comb filter, or a cascaded integrator-comb (CIC) filter as known in the art. FIG. 4 illustrates an embodiment of a CIC decimation filter 400 that includes three cascaded integrators 401, a downsampling unit 402 by a factor M, and three cascaded comb filters 403. It should be appreciated that the structure of a digital decimation filter shown in FIG. 4 is just one of many examples of possible decimation filter structures. In alternative embodiments of the present invention, the digital decimation filter may be implemented using other types of decimation filter circuits known in the art.

Figure 5:
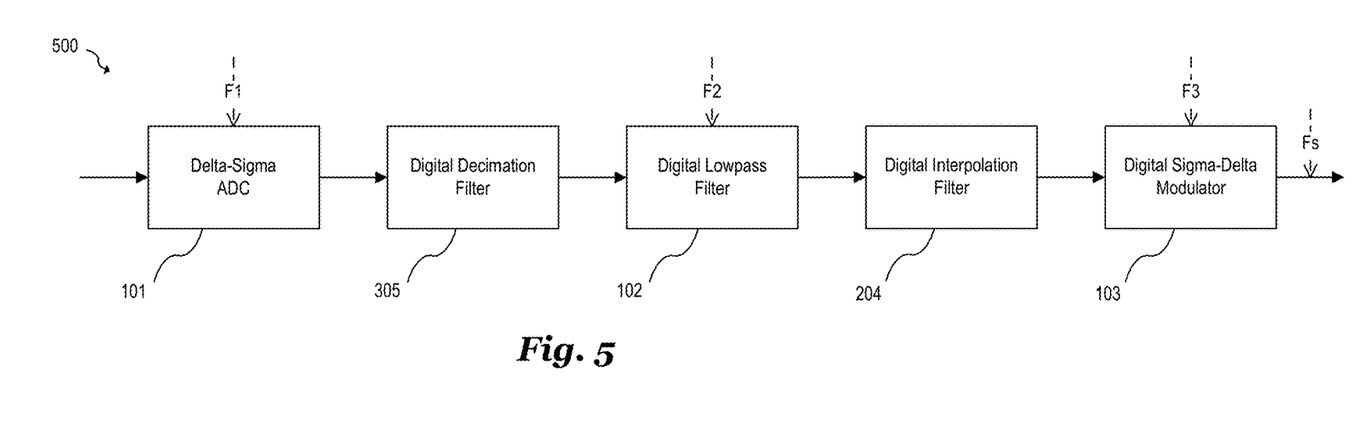
FIG. 5 illustrates a block diagram of another embodiment digital microphone interface circuit.

In other embodiments, the digital sigma-delta modulator 103 may operate at the target frequency in order to provide sufficient performance, while delta-sigma ADC 101 and digital lowpass filter 102 operate at a lower sampling frequency. FIG. 5 illustrates a block diagram of another embodiment digital microphone interface circuit 500 that includes a delta-sigma ADC 101, a digital decimation filter 305, a digital lowpass filter 102, a digital interpolation filter 204 and a digital sigma-delta modulator 103. Delta-sigma ADC 101 is configured to operate at sampling frequency F1. Digital decimation filter 305 is coupled to an output of delta-sigma ADC 101. Digital lowpass filter 102 is coupled to an output of digital decimation filter 305, and is configured to operate at sampling frequency F2. Digital interpolation filter 204 is coupled to an output of digital lowpass filter 102. Digital sigma-delta modulator 103 is coupled to an output of digital interpolation filter 204, and is configured to operate at sampling frequency F3.

F1 may be equal to or lower than the target sampling frequency Fs. F2 is lower than Fs, and F3 is equal to F3. The decimation factor of digital decimation filter 305 is $$\frac{F_1}{F_2},$$

and the interpolation factor of digital interpolation filter 204 is $$\frac{F_3}{F_2}.$$

In one example, delta-sigma ADC 101 operates at the target sampling frequency 1.5 MHz (F1=Fs=1.5 MHz). Digital decimation filter 305 downsamples an output signal of delta-sigma ADC 101 by factor 2. Digital lowpass filter 102 operates at 750 kilohertz (KHz). Digital interpolation filter 204 upsamples an output signal of digital lowpass filter 102 by factor 2. Digital sigma-delta modulator 103 also operates at 3 MHz. In another example which uses a 6 MHz target sampling frequency (Fs=6 MHz), F1=3 MHz, F2=1.5 MHz and Fs=6 MHz. The decimation factor is 2 and the interpolation factor is 4.

Figure 6:
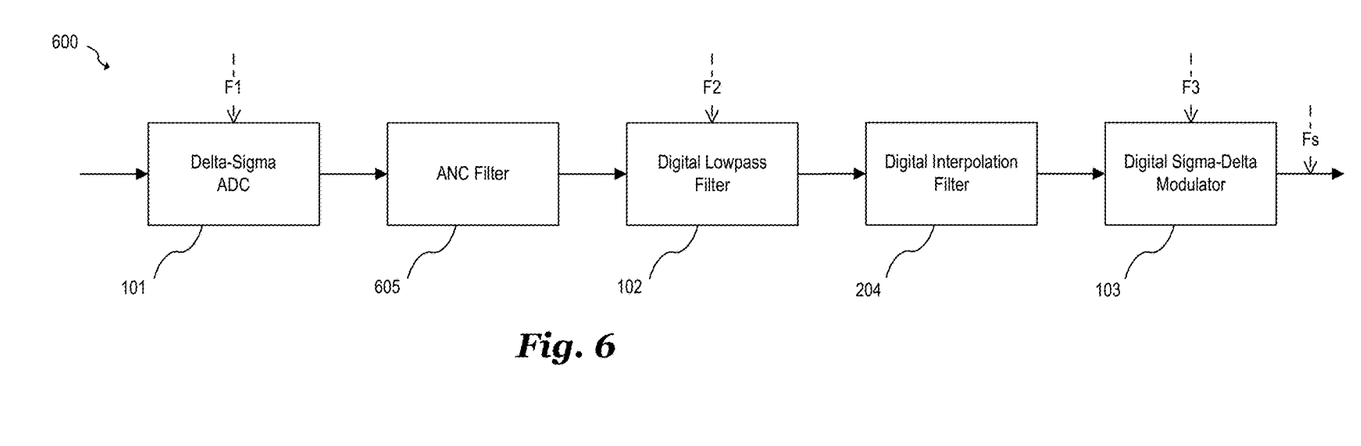
FIG. 6 illustrates a block diagram of another embodiment digital microphone interface circuit.

In various embodiments, an active noise control (ANC) filter is included in the digital microphone interface circuit in order to reduce a group delay distortion of an output signal of the delta-sigma ADC. The ANC filter may also be referred to as a Boost filter. FIG. 6 illustrates a block diagram of another embodiment digital microphone interface circuit 600 that includes an ANC filter 605. As shown, the structure of digital microphone interface circuit 600 is similar to FIG. 2, except that there is an ANC filter 605 coupled between delta-sigma ADC 101 and digital lowpass filter 103. ANC filter 605 may reduce the group delay distortion of the output signal of delta-sigma ADC 101. It should be appreciated that the ANC filter may also be included in alternative embodiments of the present invention, such as the digital microphone interface circuits shown in FIG. 3 and FIG. 5.

Figure 7:
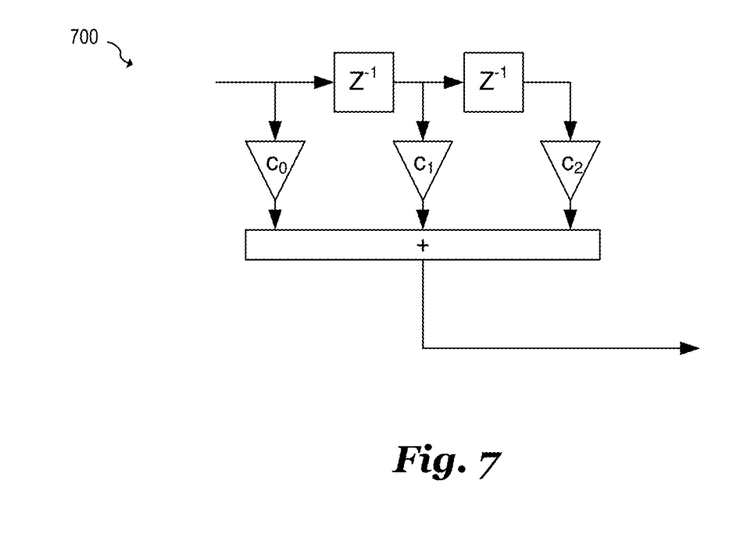
FIG. 7 illustrates an embodiment of an active noise control (ANC) filter.

The ANC filter may be implemented using a finite impulse response (FIR) filter or equalizer. FIG. 7 illustrates an embodiment of an ANC filter that includes a standard second order FIR filter 700 with 3 taps. The coefficients for each tap are C0, C1 and C2, respectively. ANC filter 700 may be implemented using shift registers, look-up tables (LUTs), multiplication units and addition units. It should be understood that the structure shown in FIG. 7 is just one example of many possible circuits that could be used to implement embodiment ANC filters. In alternative embodiments other circuits could be used such as those described in U.S. patent application Ser. No. 15/643,506 entitled "Sensor Arrangement Having an Optimized Group Delay and Signal Processing Method" filed on Jul. 7, 2017, which is incorporated herein by reference in its entirety.

In various embodiments of the present invention, the digital microphone interface circuit may include an interface circuit coupled to an output of a digital sigma-delta modulator of the digital microphone interface circuit. The interface circuit may include a buffer and an output configured to be coupled to a codec device. The interface circuit may adjust a format of an output signal of the digital sigma-delta modulator and make the format of the output signal fulfill specifications of the codec device.

Figure 8:
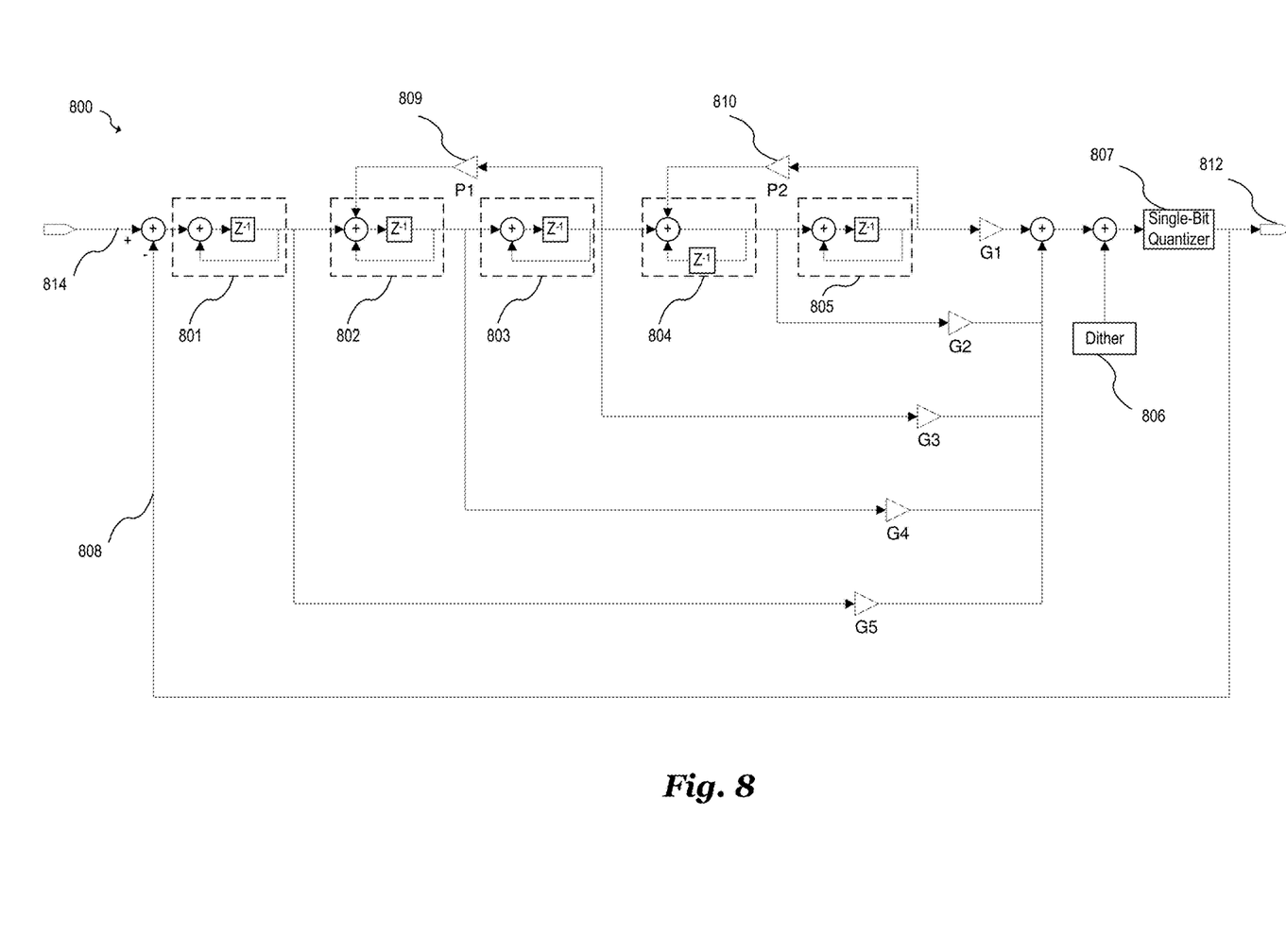
FIG. 8 illustrates an embodiment of a digital sigma-delta modulator.

FIG. 8 illustrates a block diagram of an embodiment digital sigma-delta modulator 800. As shown, the digital sigma-delta modulator may be a $5^{th}$ order noise shaper that includes five digital integrators/accumulators 801-805, a dither 806, a single-bit quantizer 807 and a feedback loop 808. Output signal 812 is subtracted from input signal 814 through feedback loop 808. Integrators 801-805 forms a noise shape filter, whose response may be determined by amplifier gains G1-G5 associated with each integrator. Dither 806 intentionally adds noises to an input signal of quantizer 807 in order to randomize quantization errors and prevent periodic limit cycles. Quantizer 807 performs quantization and generates an output signal—bitstream 812. The rate of bitstream 812 is equal to the sampling frequency of digital sigma-delta modulator 800. Digital sigma-delta modulator 800 also includes resonator 809 with gain P1 and resonator 810 with gain P2, where the gains P1 and P2 may determine resonance frequencies of resonators 809 and 810. It should be appreciated that the structure shown in FIG. 8 is just one example, and many possible circuits may be used to implement embodiment digital sigma-delta modulators.

Figure 9:
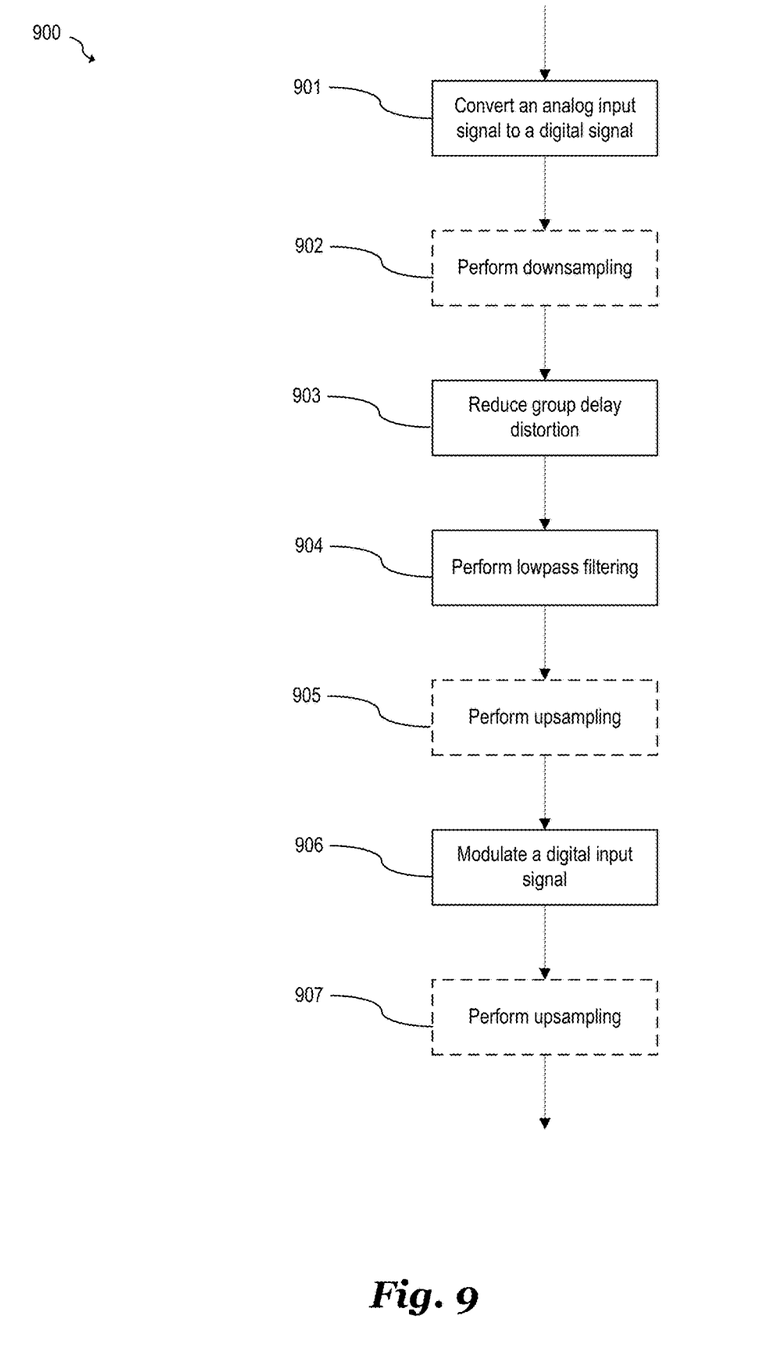
FIG. 9 illustrates a flowchart of an embodiment microphone signal processing method.

FIG. 9 illustrates a flowchart 900 of an embodiment method that may be applied to all of the disclosed embodiments of the digital microphone interface circuit. As shown, the method 900 begins with step 901, where an analog input is converted to a digital signal by a delta-sigma ADC. The delta-sigma ADC operates at sampling frequency F1, and generates an output digital signal of sampling frequency F1. In optional step 902, a downsampling procedure may be performed by a decimation filter. In this procedure, the sampling frequency of the output digital signal of the delta-sigma ADC is decreased from F1 to F2, where F2 is a sampling frequency of an ANC filter in step 903. Step 902 may occur if the sampling frequency F2 is lower than F1, and may not be necessary if F2 is equal to F1 in some embodiments. In step 903, a group delay distortion is removed from an input signal by the ANC filter. Method 900 proceeds to step 904, where an output signal of the ANC filter is then processed by a lowpass filter operating at sampling frequency F2. Only one of optional step 905 and optional step 907 may occur depending on a target sampling frequency Fs of the digital microphone interface circuit and a sampling frequency F3 that a digital sigma-delta modulator operates at in step 906. In step 906, the digital sigma-delta modulator modulates an input signal and generates an output signal of sampling frequency F3. In some embodiments where F3 is equal to Fs and F3 is higher than F2, step 905 may occur and step 907 may not be necessary. In step 905, an output signal of the lowpass filter in step 904 is upsampled by a digital interpolation filter, and the sampling frequency is increased from F2 to Fs. In some other embodiments, where F3 is equal to F2, and both F2 and F3 are lower than Fs, only step 907 is used. In step 907, the sampling frequency of the output signal of the digital sigma-delta modulator is increased from F3 to Fs.

Figure 10:
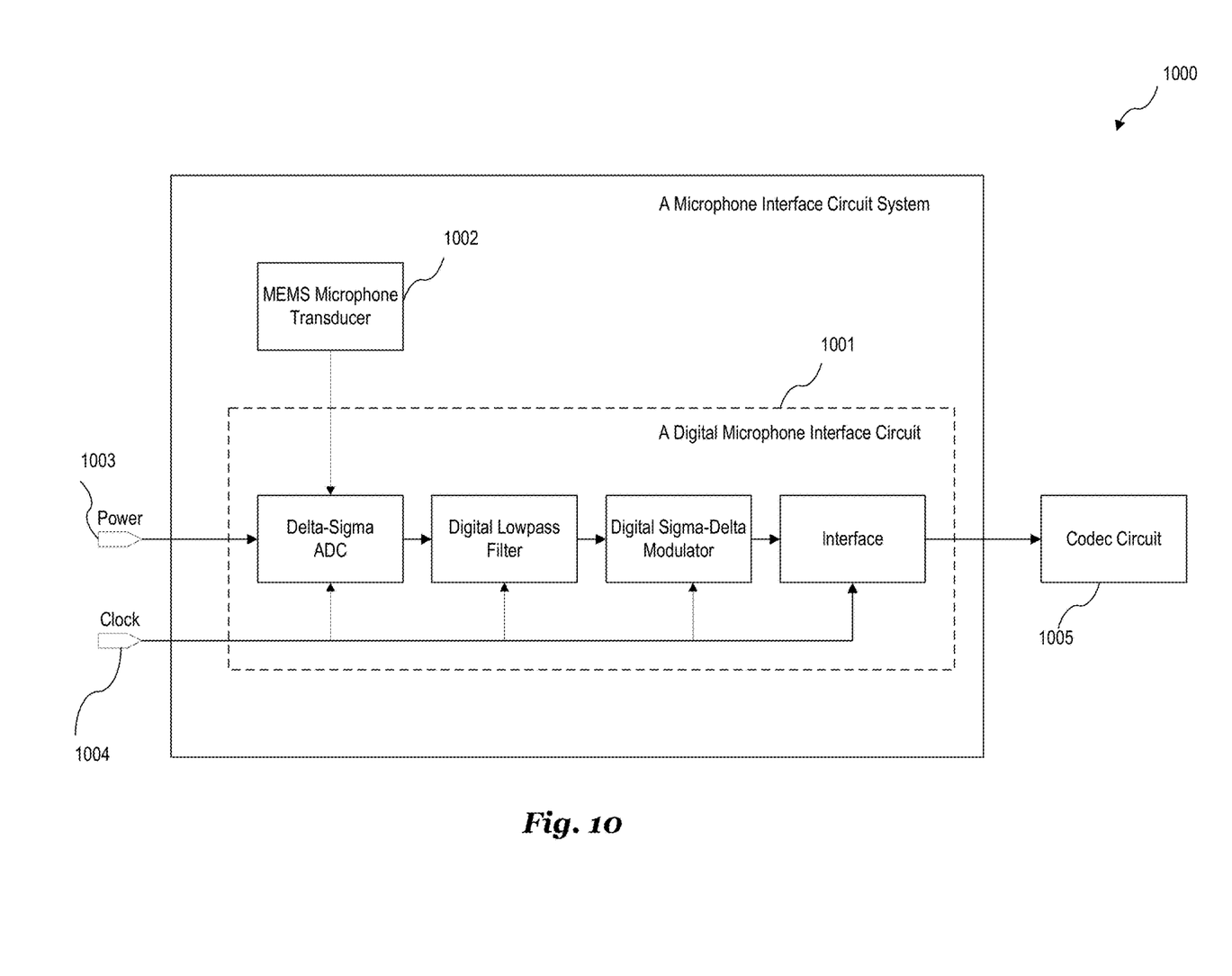
FIG. 10 illustrates a block diagram of an embodiment microphone interface circuit system.

FIG. 10 illustrates a block diagram of a microphone interface circuit system 1000 that includes a digital microphone interface circuit 1001, a MEMS microphone transducer 1002, a power supply 1003 and a clock input 1004. Digital microphone interface circuit 1001 includes a delta-sigma ADC, a digital lowpass filter, a digital sigma-delta modulator and an interface circuit. It should be appreciated that digital microphone interface circuit 1001 may include other electronic components as described in various embodiments of the present invention. An input of digital microphone interface circuit 1001 is coupled to MEMS microphone transducer 1002. Digital microphone interface circuit 1001 is also coupled to power supply 1003 and clock input 1004. Although not shown in FIG. 10, MEMS microphone transducer 1002 may also be coupled to power supply 1003. An output of digital microphone interface circuit 1001 is coupled to codec circuit 1005.

Example embodiments of the present invention are summarized here. Other embodiments can also be understood from the entirety of the specification and the claims filed herein.

Example 1

A microphone interface circuit including: a delta-sigma analog-to-digital converter (ADC) configured to operate at a first sampling frequency, the delta-sigma ADC having an input configured to be coupled to a microphone; a digital lowpass filter coupled to an output of the delta-sigma ADC, the digital lowpass filter being configured to operate at a second sampling frequency; and a digital sigma-delta modulator coupled to an output of the digital lowpass filter, the digital sigma-delta modulator being configured to operate at a third sampling frequency, where at least one of the first sampling frequency and the third sampling frequency is higher than the second sampling frequency.

Example 2

The microphone interface circuit as in example 1, further including a first digital interpolation filter coupled between the digital lowpass filter and the digital sigma-delta modulator, where the first sampling frequency is equal to the second sampling frequency, and the third sampling frequency is higher than the second sampling frequency.

Example 3

The microphone interface circuit as in one of examples 1 or 2, further including a digital decimation filter coupled between the delta-sigma ADC and the digital lowpass filter, where the first sampling frequency is higher than the second sampling frequency.

Example 4

The microphone interface circuit as in one of examples 1-3, further including a second digital interpolation filter coupled to the digital sigma-delta modulator, where the second sampling frequency is equal to the third sampling frequency.

Example 5

The microphone interface circuit as in one of examples 1-4, where the second digital interpolation filter is configured to upsample an output of the digital sigma-delta modulator by repeating each sample of the output of the digital sigma-delta modulator a number of times.

Example 6

The microphone interface circuit as in one of examples 1-5, further including a third digital interpolation filter coupled between the digital lowpass filter and the sigma-delta digital modulator, where the third sampling frequency is higher than the second sampling frequency.

Example 7

The microphone interface circuit as in one of examples 1-6, further including a Micro-Electro-Mechanical Systems (MEMS) microphone transducer coupled to the delta-sigma ADC.

Example 8

The microphone interface circuit as in one of examples 1-7, where the first, second, and third sampling frequencies are between 750 KHz and 8 MHz.

Example 9

The microphone interface circuit as in one of examples 1-8, further including an active noise control (ANC) filter coupled between the delta-sigma ADC and the digital lowpass filter, where the ANC filter is configured to reduce a group delay distortion of the output of the delta-sigma ADC.

Example 10

The microphone interface circuit as in one of examples 1-9, where the ANC filter is a finite impulse response (FIR) filter, the digital lowpass filter is a third order infinite impulse response (IIR) filter, and the digital sigma-delta modulator is a fifth order noise shaper.

Example 11

The microphone interface circuit as in one of examples 1-10, where the output of the delta-sigma ADC is a multi-bit data stream, and an output of the digital sigma-delta modulator is a single-bit data stream.

Example 12

A microphone signal processing method including: converting, by a delta-sigma analog-to-digital converter (ADC), an analog signal to a first digital signal, where the delta-sigma ADC is configured to operate at a first sampling frequency; filtering, by a digital lowpass filter, the first digital signal to produce a second digital signal, the digital lowpass filter being configured to operate at a second sampling frequency; and modulating, by a digital sigma-delta modulator, the second digital signal at a third sampling frequency, where at least one of the first sampling frequency and the third sampling frequency is higher than the second sampling frequency.

Example 13

The microphone signal processing method as in example 12, further including: downsampling, by a digital decimation filter, the first digital signal; and upsampling, by a digital interpolation filter, an output signal of the digital sigma-delta modulator, upsampling including repeating each sample of the output signal of the digital sigma-delta modulator a number of times, where the first sampling frequency is higher than the second sampling frequency, and the second sampling frequency is equal to the third sampling frequency.

Example 14

The microphone signal processing method as in one of examples 12 or 13, where the digital lowpass filter is a third order infinite impulse response (IIR) filter, and the digital sigma-delta modulator is a fifth order digital sigma-delta modulator.

Example 15

A microphone interface circuit system including: a Micro-Electro-Mechanical Systems (MEMS) microphone transducer; a delta-sigma analog-to-digital converter (ADC) coupled to an output of the MEMS microphone transducer, the delta-sigma ADC being configured to operate at a first sampling frequency; a digital lowpass filter coupled to an output of the delta-sigma ADC, the digital lowpass filter being configured to operate at a second sampling frequency; a digital sigma-delta modulator coupled to an output of the digital lowpass filter, the digital sigma-delta modulator being configured to operate at a third sampling frequency; and an interface circuit coupled to an output of the digital sigma-delta modulator, where at least one of the first sampling frequency and the third sampling frequency is higher than the second sampling frequency.

Example 16

The microphone interface circuit system as in example 15, further including: a digital decimation filter coupled between the delta-sigma ADC and the digital lowpass filter; and a digital interpolation filter coupled to the output of the digital sigma-delta modulator, where the first sampling frequency is higher than the second sampling frequency, and the second sampling frequency is equal to the third sampling frequency.

Example 17

The microphone interface circuit system as in one of examples 15 or 16, further including: an active noise control (ANC) filter coupled between the delta-sigma ADC and the digital lowpass filter, the ANC filter reducing a group delay distortion of the output of the delta-sigma ADC.

The logical functions of the circuits and system disclosed herein may be implemented using custom digital logic, standard cell digital logic, and/or may be implemented in software running on a processor, microcontroller or digital signal processor. Such processors may include, for example, a processor core, memory coupled to the processor core and one or more input/output ports. Alternatively, other circuits and systems known in the art may be used to implement these functions. Embodiment logic circuits may also be implemented using logical equivalents. In some embodiments, active high logic described herein may be implemented using active low logic, circuits that are disclosed as being clocked on a rising edge may be clocked on a falling edge, and counters and circuit configured to be incremented may be decremented and vice-versa. Embodiment circuits may be implemented on a semiconductor substrate, such as a silicon substrate or other substrate type known in the art, using various process technologies such as Complementary Metal-Oxide-Semiconductor (CMOS), fine geometry CMOS, or other process technologies.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microphone interface circuit comprising:
   a delta-sigma analog-to-digital converter (ADC) configured to operate at a first sampling frequency, the delta-sigma ADC having an input configured to be coupled to a microphone;
   a digital lowpass filter coupled to an output of the delta-sigma ADC, the digital lowpass filter being configured to operate at a second sampling frequency; and
   a digital sigma-delta modulator coupled to an output of the digital lowpass filter, the digital sigma-delta modulator being configured to operate at a third sampling frequency, wherein at least one of the first sampling frequency and the third sampling frequency is higher than the second sampling frequency.

2. The microphone interface circuit of claim 1, further comprising a first digital interpolation filter coupled between the digital lowpass filter and the digital sigma-delta modulator, wherein the first sampling frequency is equal to the second sampling frequency, and the third sampling frequency is higher than the second sampling frequency.

3. The microphone interface circuit of claim 1, further comprising a digital decimation filter coupled between the delta-sigma ADC and the digital lowpass filter, wherein the first sampling frequency is higher than the second sampling frequency.

4. The microphone interface circuit of claim 3, further comprising a second digital interpolation filter coupled to the digital sigma-delta modulator, wherein the second sampling frequency is equal to the third sampling frequency.

5. The microphone interface circuit of claim 4, wherein the second digital interpolation filter is configured to upsample an output of the digital sigma-delta modulator by repeating each sample of the output of the digital sigma-delta modulator a number of times.

6. The microphone interface circuit of claim 3, further comprising a third digital interpolation filter coupled between the digital lowpass filter and the sigma-delta digital modulator, wherein the third sampling frequency is higher than the second sampling frequency.

7. The microphone interface circuit of claim 1, further comprising a Micro-Electro-Mechanical Systems (MEMS) microphone transducer coupled to the delta-sigma ADC.

8. The microphone interface circuit of claim 1, wherein the first, second, and third sampling frequencies are between 750 KHz and 8 MHz.

9. The microphone interface circuit of claim 1, further comprising an active noise control (ANC) filter coupled between the delta-sigma ADC and the digital lowpass filter, wherein the ANC filter is configured to reduce a group delay distortion of the output of the delta-sigma ADC.

10. The microphone interface circuit of claim 9, wherein the ANC filter is a finite impulse response (FIR) filter, the digital lowpass filter is a third order infinite impulse response (IIR) filter, and the digital sigma-delta modulator is a fifth order noise shaper.

11. The microphone interface circuit of claim 1, wherein the output of the delta-sigma ADC is a multi-bit data stream, and an output of the digital sigma-delta modulator is a single-bit data stream.

12. A microphone signal processing method comprising:
converting, by a delta-sigma analog-to-digital converter (ADC), an analog signal to a first digital signal, wherein the delta-sigma ADC is configured to operate at a first sampling frequency;
filtering, by a digital lowpass filter, the first digital signal to produce a second digital signal, the digital lowpass filter being configured to operate at a second sampling frequency; and
modulating, by a digital sigma-delta modulator, the second digital signal at a third sampling frequency, wherein at least one of the first sampling frequency and the third sampling frequency is higher than the second sampling frequency.

13. The microphone signal processing method of claim 12, further comprising:
downsampling, by a digital decimation filter, the first digital signal; and
upsampling, by a digital interpolation filter, an output signal of the digital sigma-delta modulator, upsampling comprising repeating each sample of the output signal of the digital sigma-delta modulator a number of times, wherein the first sampling frequency is higher than the second sampling frequency, and the second sampling frequency is equal to the third sampling frequency.

14. The microphone signal processing method of claim 12, wherein the digital lowpass filter is a third order infinite impulse response (IIR) filter, and the digital sigma-delta modulator is a fifth order digital sigma-delta modulator.

15. A microphone interface circuit system comprising:
a Micro-Electro-Mechanical Systems (MEMS) microphone transducer;
a delta-sigma analog-to-digital converter (ADC) coupled to an output of the MEMS microphone transducer, the delta-sigma ADC being configured to operate at a first sampling frequency;
a digital lowpass filter coupled to an output of the delta-sigma ADC, the digital lowpass filter being configured to operate at a second sampling frequency;
a digital sigma-delta modulator coupled to an output of the digital lowpass filter, the digital sigma-delta modulator being configured to operate at a third sampling frequency; and
an interface circuit coupled to an output of the digital sigma-delta modulator, wherein at least one of the first sampling frequency and the third sampling frequency is higher than the second sampling frequency.

16. The microphone interface circuit system of claim 15, further comprising:
a digital decimation filter coupled between the delta-sigma ADC and the digital lowpass filter; and
a digital interpolation filter coupled to the output of the digital sigma-delta modulator, wherein the first sampling frequency is higher than the second sampling frequency, and the second sampling frequency is equal to the third sampling frequency.

17. The microphone interface circuit system of claim 15, further comprising:
an active noise control (ANC) filter coupled between the delta-sigma ADC and the digital lowpass filter, the ANC filter reducing a group delay distortion of the output of the delta-sigma ADC.

* * * * *